(12) United States Patent
Hatanaka et al.

(10) Patent No.: US 9,294,062 B2
(45) Date of Patent: Mar. 22, 2016

(54) SOUND PROCESSING APPARATUS, METHOD, AND PROGRAM

(75) Inventors: Mitsuyuki Hatanaka, Kanagawa (JP); Toru Chinen, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 88 days.

(21) Appl. No.: 14/239,797

(22) PCT Filed: Sep. 3, 2012

(86) PCT No.: PCT/JP2012/072353
§ 371 (c)(1),
(2), (4) Date: Feb. 20, 2014

(87) PCT Pub. No.: WO2013/038937
PCT Pub. Date: Mar. 21, 2013

(65) Prior Publication Data
US 2014/0205111 A1    Jul. 24, 2014

(30) Foreign Application Priority Data
Sep. 15, 2011    (JP) .................... 2011-202168

(51) Int. Cl.
| | |
|---|---|
| *H03G 5/00* | (2006.01) |
| *H03G 9/14* | (2006.01) |
| *H03G 5/04* | (2006.01) |
| *H03G 3/00* | (2006.01) |
| *H04R 29/00* | (2006.01) |
| *H03G 5/02* | (2006.01) |
| *H03G 5/16* | (2006.01) |

(52) U.S. Cl.
CPC .................. *H03G 9/14* (2013.01); *H03G 3/001* (2013.01); *H03G 5/025* (2013.01); *H03G 5/04* (2013.01); *H03G 5/165* (2013.01); *H04R 29/00* (2013.01)

(58) Field of Classification Search
None
See application file for complete search history.

(56) References Cited

U.S. PATENT DOCUMENTS

| | | | | |
|---|---|---|---|---|
| 2011/0182439 | A1* | 7/2011 | Sakurada et al. | 381/94.1 |
| 2011/0293103 | A1* | 12/2011 | Park et al. | 381/57 |
| 2012/0239391 | A1* | 9/2012 | Duwenhorst et al. | 704/225 |
| 2013/0142343 | A1* | 6/2013 | Matsui et al. | 381/56 |

FOREIGN PATENT DOCUMENTS

| | | |
|---|---|---|
| JP | 04-276911 | 10/1992 |
| JP | 08-023250 | 1/1996 |
| JP | 09-102719 | 4/1997 |
| JP | 10-261928 | 9/1998 |
| JP | 2001-203551 | 7/2001 |

* cited by examiner

*Primary Examiner* — Muhammad N Edun
(74) *Attorney, Agent, or Firm* — Hazuki International, LLC

(57) ABSTRACT

The present technique relates to a sound processing apparatus, a method, and a program capable of alleviating degradation of the quality of sound in a case where the gain of a sound signal is amplified.

When equalizer processing for adjusting the gain of each frequency band of an input signal on the basis of a gain setting value is performed, an input signal is attenuated by an input attenuation amount derived from the gain setting value, and the equalizer processing is performed on the input signal attenuated. The amount of amplification of the gain of the input signal in the equalizer processing is estimated on the basis of the gain setting value and a weight coefficient of each frequency band derived from a generally-available music signal prepared in advance, and a difference of the estimation value and the input attenuation amount is calculated as a gain correction amount. Further, nonlinear amplification processing is performed on the input signal so as to actually amplify the input signal, which has been subjected to the equalizer processing, by a gain correction amount, and an output signal is obtained. The present technique can be applied to a sound processing apparatus.

9 Claims, 7 Drawing Sheets

SOUND PROCESSING APPARATUS, METHOD, AND PROGRAM

TECHNICAL FIELD

The present technique relates to a sound processing apparatus, a method, and a program, and more particularly, relates to a sound processing apparatus, a method, and a program capable of alleviating degradation of the quality of the sound when the gain of a sound signal is amplified.

BACKGROUND ART

In the past, the gain of each frequency band of a music signal is generally manipulated using an equalizer. At this occasion, when the gain of a particular frequency band is amplified, the amplitude of a signal that is output from the equalizer, i.e., the amplitude of a music signal of which gain has been manipulated, is beyond a recording range, and as a result, in terms of audibility, uncomfortable clip distortion may occur.

Pre-gain control processing and auto gain control processing are known as techniques for reducing such clip distortion.

In the pre-gain control processing, the amount of gain that is clipped is estimated in advance, and after a music signal is attenuated on the basis of the amount of gain, the attenuated music signal is input into an equalizer. At this occasion, the amount of attenuation of the music signal is determined by allowing a user to manually operate an attenuation knob.

In the auto gain control processing, the gain control is performed adaptively on the music signal right before input into the equalizer or right after output from the equalizer in order to prevent the music signal from being clipped in the gain operation of the music signal with the equalizer. More specifically, in a section where the clip distortion occurs, the signal waveform of the music signal is forcibly deformed so that the amplitude of the signal is not beyond the recording range.

For example, as shown in the upper side of FIG. 1, suppose that the music signal having the waveform indicated by arrow Q11 is input into the equalizer 11, and the gain adjustment of particular frequency band is done, and a music signal having a waveform indicated by arrow Q12 is obtained as output. In the waveform indicated by arrow Q12, a portion of the waveform where the amplitude is excessively amplified, i.e., a portion indicated by a dotted line, is clipped and has distorted waveform. When such clip distortion occurs, the sound is destroyed when the music signal is played, and the quality of the sound is degraded.

Accordingly, an apparatus that performs the pre-gain control processing and the auto gain control processing is provided with an attenuation circuit 12 in a stage prior to the equalizer 11 as shown in the lower side in the figure, and the music signal of which waveform is to be processed indicated by arrow Q21 is input into the attenuation circuit 12. When the attenuation processing is performed on the music signal by the attenuation circuit 12, a music signal having a waveform of which gain has been attenuated indicated by arrow Q22 is obtained, and this music signal is provided to the equalizer 11 so that the gain is adjusted.

Then, with the gain adjustment of the music signal that is performed by the equalizer 11, a music signal having a waveform indicated by arrow Q23 is obtained as an output. The gain of the music signal thus obtained is attenuated by the attenuation circuit 12 in advance in accordance with the gain that is excessively amplified by the equalizer 11, and therefore, the clip distortion can be alleviated.

In addition, in a technique for reducing clip distortion, peaking filters of multiple frequency bands are connected in series (for example, see Patent Document 1). In this technique, in later stages, filter processing is performed on the signal with the peaking filters for higher frequency, and therefore, harmonics components of distortion generated by clipping of the signal is less likely to be amplified by filters in later stages.

CITATION LIST

Patent Documents

Patent Document 1: JP 8-23250 A

SUMMARY OF THE INVENTION

Problems to be Solved by the Invention

However, in the technique explained above, it used to be difficult to sufficiently alleviate degradation of the quality of the sound, which may occur when the gain of a music signal is amplified.

For example, in the pre-gain control processing, the user has to operate an attenuation knob in an intuitive manner to adjust the amount of attenuation of the gain, and therefore, it is difficult to designate the optimum amount of attenuation, and the optimum amount of attenuation is also different for each song, and it is cumbersome for the user to perform the operation, which is inconvenient. When the amount of attenuation designated by the user is not appropriate, the clip distortion may occur in the music signal, and the amplitude of the music signal becomes too small or too much.

In the auto gain control processing, the amount of attenuation of the gain is automatically adjusted according to the amplitude change of the music signal, and therefore, the user does not have to designate the optimum amount of attenuation on every occasion, but in the section where the clip occurs, the gain is forcibly attenuated, i.e., the signal waveform is deformed. Therefore, there occur not only a section where the signal waveform is deformed but also a section where the signal waveform is not deformed, and the gain of the music signal is unnaturally is changed, and in terms of audibility, the music signal that is played becomes unstable and gives uncomfortable feeling to the user The present technique is made in view of such circumstances, and is to enable of alleviating degradation of the quality of the sound when the gain of a sound signal is amplified.

Solutions to Problems

A sound processing apparatus of an aspect of the present technique includes an input attenuation amount calculation unit configured to calculate an input attenuation amount for attenuating a sound signal, on the basis of a gain setting value representing an adjustment amount of a gain of each frequency band of a sound signal in equalizer processing, an estimation gain amplification amount calculation unit configured to calculate an estimation gain amplification amount which is an estimation value of a gain of the sound signal amplified by the equalizer processing, on the basis of the gain setting value and a weight coefficient derived for each of the frequency bands, a gain correction amount calculation unit configured to calculate a gain correction amount on the basis of the input attenuation amount and the estimation gain amplification amount, an input gain attenuation unit configured to attenuate the sound signal on the basis of the input attenuation amount, an equalizer processing unit configured to perform the equalizer processing on the sound signal attenuated by the input gain attenuation unit, on the basis of the gain setting value, and adjust the gain of each of the frequency bands of the sound signal, and a gain correction unit configured to correct the gain of the sound signal having been subjected to the equalizer processing, on the basis of the gain correction amount.

The sound processing apparatus may further provided with a coefficient calculation unit configured to calculate the weight coefficient, on the basis of an energy distribution of a frequency of the sound signal prepared in advance.

For each of the frequency bands, the coefficient calculation unit may derive an energy change amount of the sound signal prepared in advance that changes when the gain of the frequency band of the sound signal prepared in advance is amplified by a predetermined value, and calculate the weight coefficient of a particular frequency band on the basis of a summation of the energy change amount of each of the frequency bands and a ratio of the energy change amount of the particular frequency band.

The estimation gain amplification amount calculation unit may calculate, as the estimation gain amplification amount, a summation of the gain setting value multiplied by the weight coefficient.

The gain correction amount calculation unit may calculate the gain correction amount by deriving a difference of the input attenuation amount and the estimation gain amplification amount.

The gain correction unit may perform nonlinear amplification processing on the sound signal on the basis of the gain correction amount so as to amplify the gain of the sound signal.

The gain correction unit may perform linear amplification processing on the sound signal so as to amplify the gain of the sound signal by a predetermined amount of the gain correction amounts, and thereafter perform the nonlinear amplification processing on the sound signal so as to amplify the gain of the sound signal having been subjected to the linear amplification processing, by an amount obtained by subtracting the predetermined amount from the gain correction amount.

A sound processing method or a program of an aspect of the present technique includes an input attenuation amount calculation step for calculating an input attenuation amount for attenuating a sound signal, on the basis of a gain setting value representing an adjustment amount of a gain of each frequency band of a sound signal in equalizer processing, an estimation gain amplification amount calculation step for calculating an estimation gain amplification amount which is an estimation value of a gain of the sound signal amplified by the equalizer processing, on the basis of the gain setting value and a weight coefficient derived for each of the frequency bands, a gain correction amount calculation step for calculating a gain correction amount on the basis of the input attenuation amount and the estimation gain amplification amount, an input gain attenuation step for attenuating the sound signal on the basis of the input attenuation amount, an equalizer processing step for performing the equalizer processing on the sound signal attenuated in the input gain attenuation step, on the basis of the gain setting value, and adjusting the gain of each of the frequency bands of the sound signal, and a gain correction step for correcting the gain of the sound signal having been subjected to the equalizer processing, on the basis of the gain correction amount.

According to an aspect of the present technique, an input attenuation amount for attenuating a sound signal is calculated on the basis of a gain setting value representing an adjustment amount of a gain of each frequency band of a sound signal in equalizer processing, and an estimation gain amplification amount which is an estimation value of a gain of the sound signal amplified by the equalizer processing is calculated on the basis of the gain setting value and a weight coefficient derived for each of the frequency bands, and a gain correction amount is calculated on the basis of the input attenuation amount and the estimation gain amplification amount, and the sound signal is attenuated on the basis of the input attenuation amount, and the equalizer processing is performed on the sound signal attenuated in the input gain attenuation step, on the basis of the gain setting value, and the gain of each of the frequency bands of the sound signal is adjusted, and the gain of the sound signal having been subjected to the equalizer processing is corrected on the basis of the gain correction amount.

EFFECTS OF THE INVENTION

According to an aspect of the present technique, the degradation of the quality of the sound is alleviated.

MODES FOR CARRYING OUT THE INVENTION

Hereinafter, embodiments to which the present technique will be explained with refernece to drawings.
<First Embodiment>
[Overview of the Present Technique]

First, overview of the present technique will be explained. In the present technique, when an equalizer performs equalizer processing on a sound signal such as a music signal, the gain of the sound signal is appropriately adjusted before and after the equalizer processing, whereby, the present technique alleviates degradation of the quality of the sound such as clip distortion. Hereinafter, a sound signal which is to be processed is a signal of a song, i.e., a music signal, and a music signal which is to be processed will be referred to as an input signal. The equalizer processing and the like are performed on the input signal, and the sound signal ultimately obtained will be referred to as an output signal.

Figure 1:
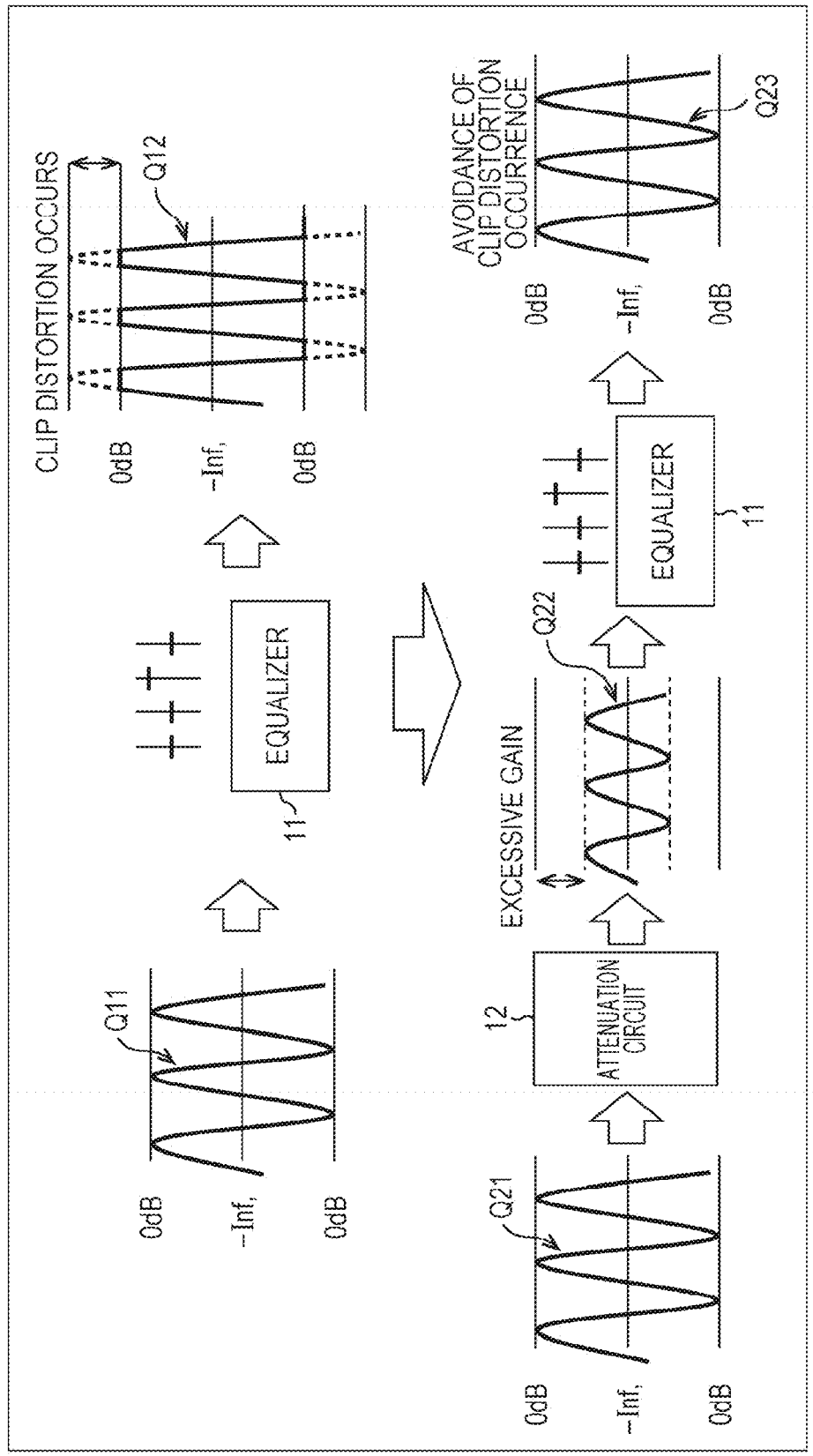
FIG. 1 is a figure for explaining conventional equalizer processing.
Figure 2:
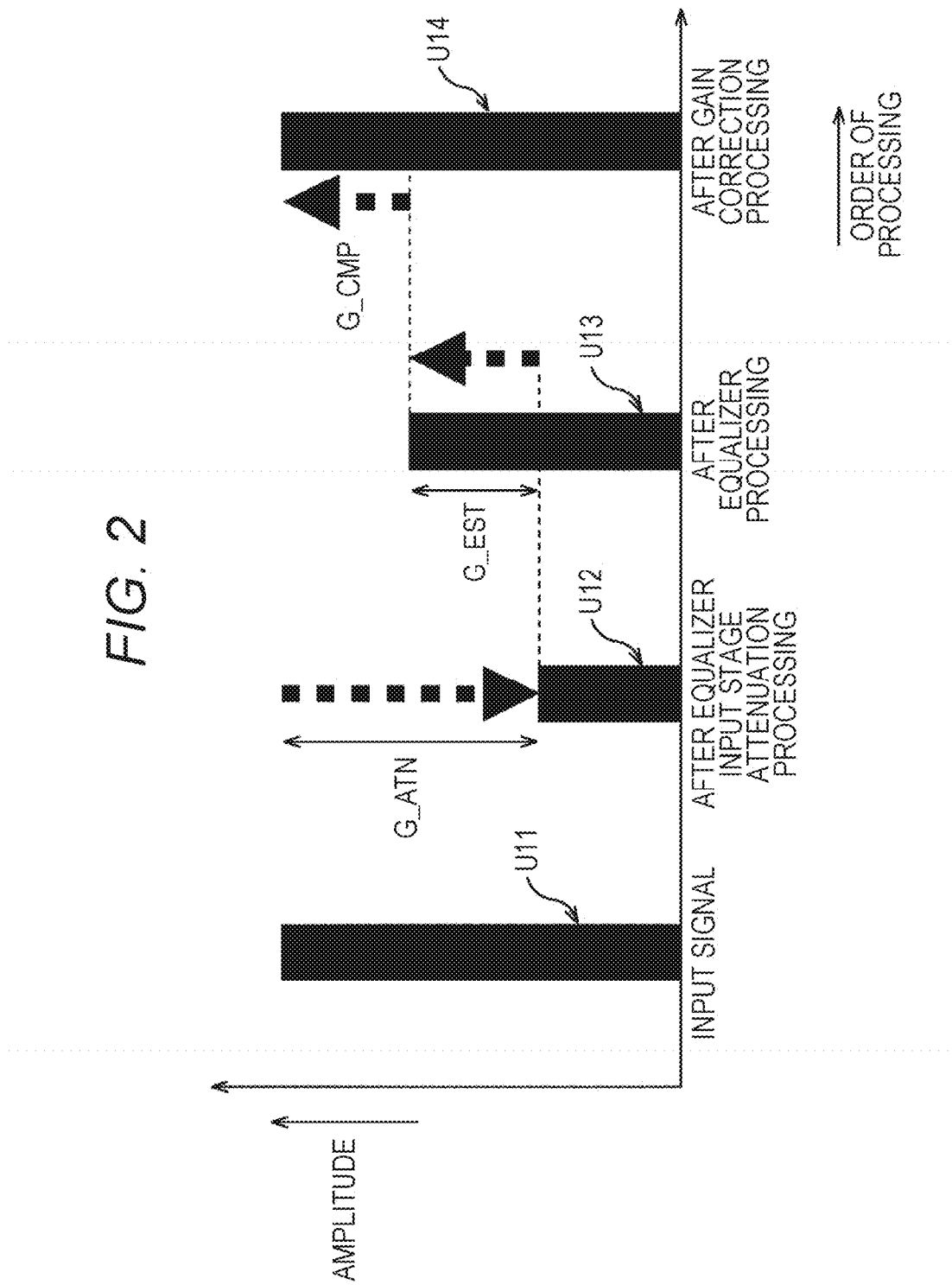
FIG. 2 is a figure for explaining equalizer processing to which the present technique is applied.

When the sound processing apparatus to which the present technique is applied receives an input signal as shown in FIG. 2, the sound processing apparatus performs attenuation processing on an input signal, and performs equalizer processing on an input signal which has been subjected to the attenuation processing. Then, the sound processing apparatus performs gain correction processing on the input signal which has been subjected to the equalizer processing to generate an output signal.

In FIG. 2, the horizontal direction indicates the order of each processing performed on the input signal, and the vertical direction indicates the magnitude of the amplitude of the input signal. Arrow U11 to arrow U14 denote the amplitude of the input signal, the amplitude of the input signal which has been subjected to the attenuation processing, the amplitude of the input signal which has been subjected to the equalizer processing, and the input signal which has been subjected to the gain correction processing, i.e., the amplitude of the output signal, respectively.

In the example of FIG. 2, first, the attenuation processing is performed on the input signal having an amplitude indicated by arrow U11 on the basis of an input attenuation amount G_ATN, and an input signal having an amplitude indicated by arrow U12 is obtained.

In this case, an input attenuation amount G_ATN denotes the amount of gain generally indicating the input signal, by which the equalizer processing is amplified on the input signal.

For example, in the equalizer processing performed on the input signal, the gain adjustment is performed on the component of each frequency band of the input signal, on the basis of a gain setting value designated by the user for each frequency band. The gain setting value of a predetermined frequency band $F_k$ (however, $1 \leq k \leq N$) is a value indicating the amount of amplification of the gain of the component of the frequency band $F_k$ of the input signal, and in the equalizer processing, the gain of the component of each frequency band of the input signal is amplified by the gain setting value of the frequency band.

The input attenuation amount G_ATN is calculated on the basis of the gain setting value of each frequency band designated by the user, and more specifically, indicates the maximum value of the estimation values of the gain amplification amounts of the frequency band components of the input signal for the equalizer processing.

After the attenuation processing, the equalizer processing is performed on the input signal having the amplitude indicated by arrow U12 on the basis of the gain setting value which has been set by the user, and then the input signal having the amplitude indicated by arrow U13 is obtained. As compared with the input signal before the equalizer processing, the amplitude of the input signal (gain) is amplified by a difference between the amplitude indicated by arrow U13 and the amplitude indicated by arrow U12.

In the sound processing apparatus, the estimation value of the amount of gain amplified in the equalizer processing, i.e., the estimation gain amplification amount G_EST which is the estimation value of the amplification amount of the energy of the entire input signal, are calculated before the equalizer processing, on the basis of the weight coefficient $CR_k$ and the gain setting value $EQ_k$ for each frequency band $F_k$.

In this case, for example, the weight coefficient $CR_k$ of each frequency band $F_k$ is calculated by estimation from the statistical amount of the energy distribution of each frequency of generally available music signal (which may also be hereinafter also referred to as model music signal). As the gain adjustment with the gain setting value $EQ_k$ contributes more greatly to the amplification of the energy of the entire model music signal, the value of the weight coefficient $CR_k$ increases.

In the sound processing apparatus, the difference of the absolute values of the input attenuation amount G_ATN of the estimation gain amplification amount G_EST thus estimated is obtained as the gain correction amount G_CMP during the gain correction processing that is performed on the input signal having been subjected to the equalizer processing.

Then, on the basis of the gain correction amount G_CMP, the gain correction processing is performed on the input signal having the amplitude indicated by arrow U13 having been subjected to the equalizer processing, and an output signal having an amplitude indicated by arrow U14 is obtained.

The gain correction amount G_CMP is the difference between the input attenuation amount G_ATN and the estimation gain amplification amount G_EST, and therefore, in the gain correction processing, the amplitude of the input signal (gain) is amplified so that it becomes substantially the same as the amplitude of the input signal that is input into the sound processing apparatus. Also in FIG. 2 the amplitude of the output signal indicated by arrow U14 is substantially the same as the amplitude of the input signal indicated by arrow U11, and it is understood that an output signal having substantially the same gain as the input signal is obtained.

As described above, in order to alleviate the clip distortion, the sound processing apparatus performs the attenuation processing on the input signal, and performs the equalizer processing on the signal obtained as a result. Then, the gain correction processing is performed on the signal obtained from the equalizer processing, which is made into an output signal.

Accordingly, while reflecting the gain amplification characteristics due to the equalizer processing, the clip distortion that occurs with the gain amplification can be alleviated, and the sound can be reproduced without distortion feeling. The weight coefficient $CR_k$ is obtained in a fixed manner on the basis of the distribution of the energy of each frequency of the generally available sound signal, and the gain correction is performed with the gain correction amount G_CMP calculated using the weight coefficient $CR_k$, so that this can eliminate uncomfortable change of the sound pressure, which occurs with a conventional auto gain control processing, and the quality of the sound can be improved.

[Calculation of Input Attenuation Amount]

Subsequently, an example of specific calculation method of the estimation gain amplification amount G_EST and the input attenuation amount G_ATN used in the sound processing generating the output signal explained above will be explained.

Figure 3:
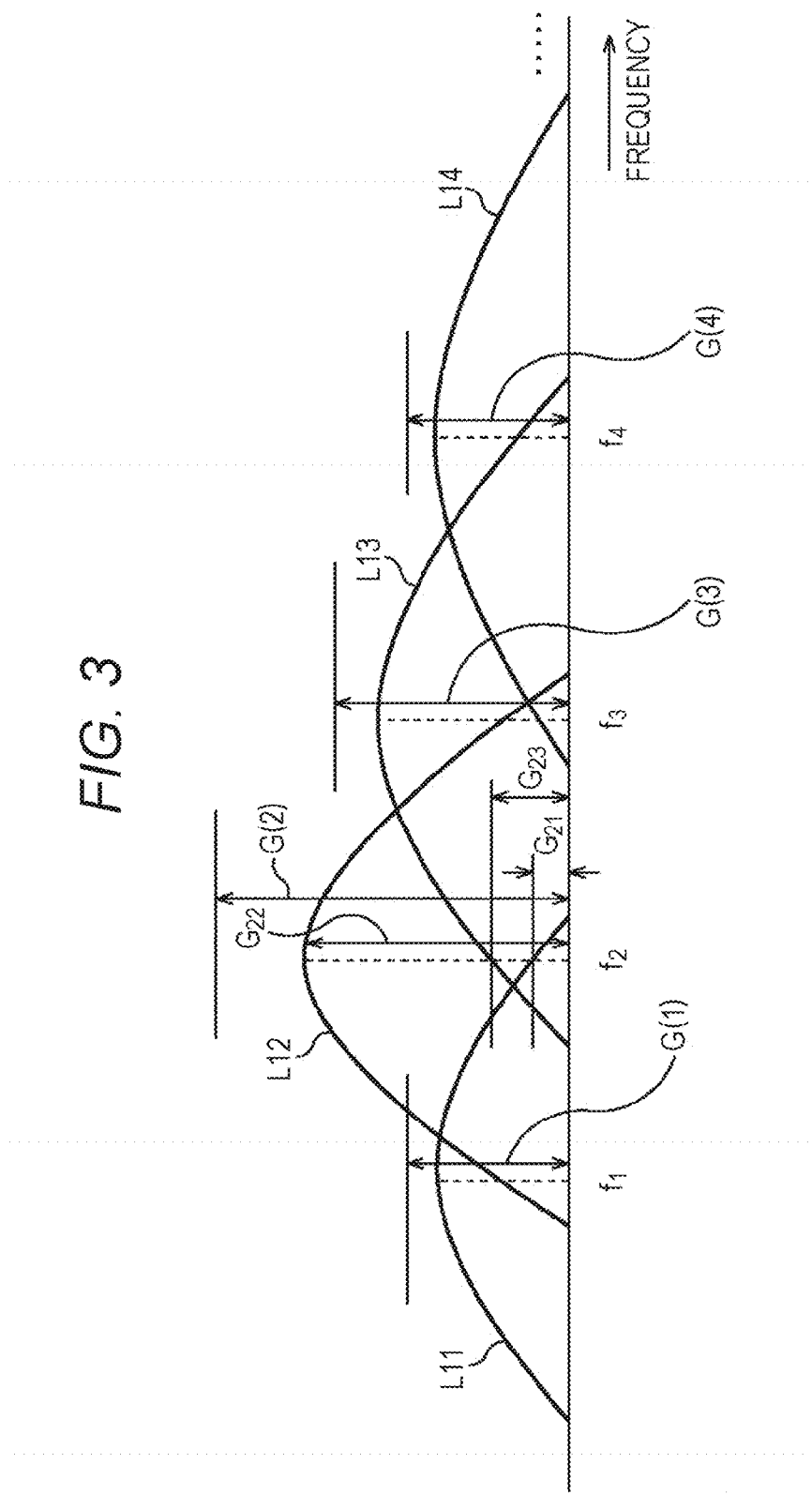
FIG. 3 is a figure for explaining calculation of an input attenuation amount.

First, in the calculation of the input attenuation amount G_ATN, for example, as shown in FIG. 3, the gain characteristics of the frequency band $F_k$ are obtained on the basis of the gain setting value $EQ_k$ of each frequency band $F_k$ designated by the user. In FIG. 3, the horizontal direction denotes the frequency, and the vertical direction denotes the gain of each frequency. In particular, in the figure, characters $f_1$ to $f_4$ arranged in the horizontal direction represent frequencies in the centers of frequency bands $F_1$ to $F_4$, respectively.

In the example of FIG. 3, a curved line L11 to a curved line L14 represent the gain characteristics of the frequency band $F_1$ to the frequency band $F_4$, respectively.

More specifically, for example, the curved line L11 indicating the gain characteristic of the frequency band $F_1$ represents the amount of amplification of the gain of each frequency, generated when the gain of the frequency $f_1$ is amplified on the basis of the gain setting value $EQ_1$ of the frequency band $F_1$. In this case, for example, when the gain setting value $EQ_1$ of the frequency band $F_1$ is the amount by which the gain of the frequency $f_1$ in the center of the frequency band $F_1$ is amplified, then, the value of the curved line L11 at the frequency $f_1$ is the gain setting value $EQ_1$.

The curved line L11 has a positive value even at the position of the frequency of frequency band $F_2$ adjacent to the frequency band $F_1$, and the gain amplification by the gain setting value of each frequency band may affect the gain of another frequency band.

Now, the amount of gain by which the frequency $f_k$ in the center of the frequency band $F_k$ (however, $1 \leq k \leq N$) is amplified by being affected by the gain amplification of the frequency $f_m$ by the gain setting value of the frequency band $F_m$ (however, $1 \leq m \leq N$) will be referred to as a gain amplification amount $G_{km}$. The gain amplification amount $G_{km}$ can be derived from the gain setting value $EQ_m$ of the frequency band $F_m$.

In this case, when the equalizer processing is performed based on the gain setting value designated for each frequency band, and the gain of each frequency band is amplified, the gain of the frequency $f_k$ is amplified by a summation of each gain amplification amount $G_{km}$, i.e., a summation of the gain amplification amounts $G_{k1}$ to $G_{kN}$. Hereinafter, the amount of amplification of the gain of the frequency $f_k$ derived from the summation of the gain amplification amounts $G_{km}$ may also be referred to as a gain amplification amount $G(k)$.

In FIG. 3, arrows $G(1)$ to $G(4)$ show the gain amplification amounts $G(1)$ to $G(4)$ of the frequencies $f_1$ to $f_4$ (frequency bands $F_1$ to $F_4$). For example, when attention is given to the frequency $f_2$, it is understood that the contribution rate for the gain amplification amount $G(2)$ is highest at the gain amplification amount $G_{22}$ of the frequency $f_2$. It is understood that the contribution rate for the gain amplification amount $G(2)$ of the gain amplification amount $G_{21}$ and the gain amplification amount $G_{23}$ by the frequency band $F_1$ and the frequency band $F_3$ adjacent to the frequency band $F_2$ including the frequency $f_2$ is also higher than the gain amplification amount of another frequency band.

When the gain amplification amount $G(k)$ for each frequency band $F_k$ is calculated in this manner, the following expression (1) is calculated on the basis of the gain amplification amount $G(k)$, and the input attenuation amount $G\_ATN$ is calculated.

$$G\_ATN = -MAX(\Sigma G_{km}) \quad (1)$$

It should be noted that in the expression (1), $\Sigma G_{km}$ denotes a summation of the gain amplification amounts $G_{km}$ (however, $1 \leq m \leq N$). More specifically, $\Sigma G_{km}$ denotes the gain amplification amount $G(k)$. In the expression (1), MAX ($\Sigma G_{km}$) indicates a function that outputs the maximum value of the gain amplification amounts $G(k)$ (however, $1 \leq k \leq N$). Therefore, the input attenuation amount $G\_ATN$ is obtained by multiplying the maximum value of the gain amplification amounts $G(k)$ of each frequency band by "$-1$".

As described above, the amount of amplification of the gain of each frequency band amplified when the equalizer processing is performed on the basis of the gain setting value is derived by estimation, and the value obtained by inverting the sign of the maximum value of the estimation value of the gain amplification amount is adopted as the input attenuation amount $G\_ATN$. It should be noted that the input attenuation amount $G\_ATN$ may be calculated by any method, not limited to the above example, as long as it is a method capable of obtaining a rough estimation value of the energy (gain) amount of the entire input signal amplified by the equalizer processing.

[Calculation of Estimation Gain Amplification Amount]

The estimation gain amplification amount $G\_EST$ is calculated from the gain setting value $EQ_k$ and the weight coefficient $CR_k$ of the frequency band $F_k$ as described above. More specifically, as shown in the following expression (2), the estimation gain amplification amount $G\_EST$ is calculated by deriving a summation of each gain setting value $EQ_k$ multiplied by the weight coefficient $CR_k$.

$$G\_EST = (CR_1 \times EQ_1) + (CR_2 \times EQ_2) + (CR_2 \times EQ_2) + \ldots + (CR_N \times EQ_N) \quad (2)$$

The weight coefficient $CR_k$ (however, $1 \leq k \leq N$) used for calculation of the estimation gain amplification amount $G\_EST$ is the amount of energy of the entire sound signal, i.e., the gain amplification amount of the entire sound signal, which changes when the gain of the frequency band $F_k$ of the sound signal (model music signal) is amplified by 1 dB.

Therefore, the gain setting value $EQ_k$ multiplied by the weight coefficient $CR_k$ is the gain amplification amount of the entire sound signal that occurs when the gain of the frequency band $F_k$ is amplified by the gain setting value $EQ_k$. The estimation gain amplification amount $G\_EST$ is the summation of the gain amplification amounts of the entire sound signal generated by the gain adjustment of the frequency band, derived for each frequency band, and therefore, it can be said to be the estimation value of the amount of amplification of the gain of the entire sound signal amplified by the equalizer processing.

As described above, the weight coefficient $CR_k$ of each frequency band $F_k$ is, for example, calculated by estimation from the statistical amount of the energy distribution of each frequency of the model music signal.

Figure 4:
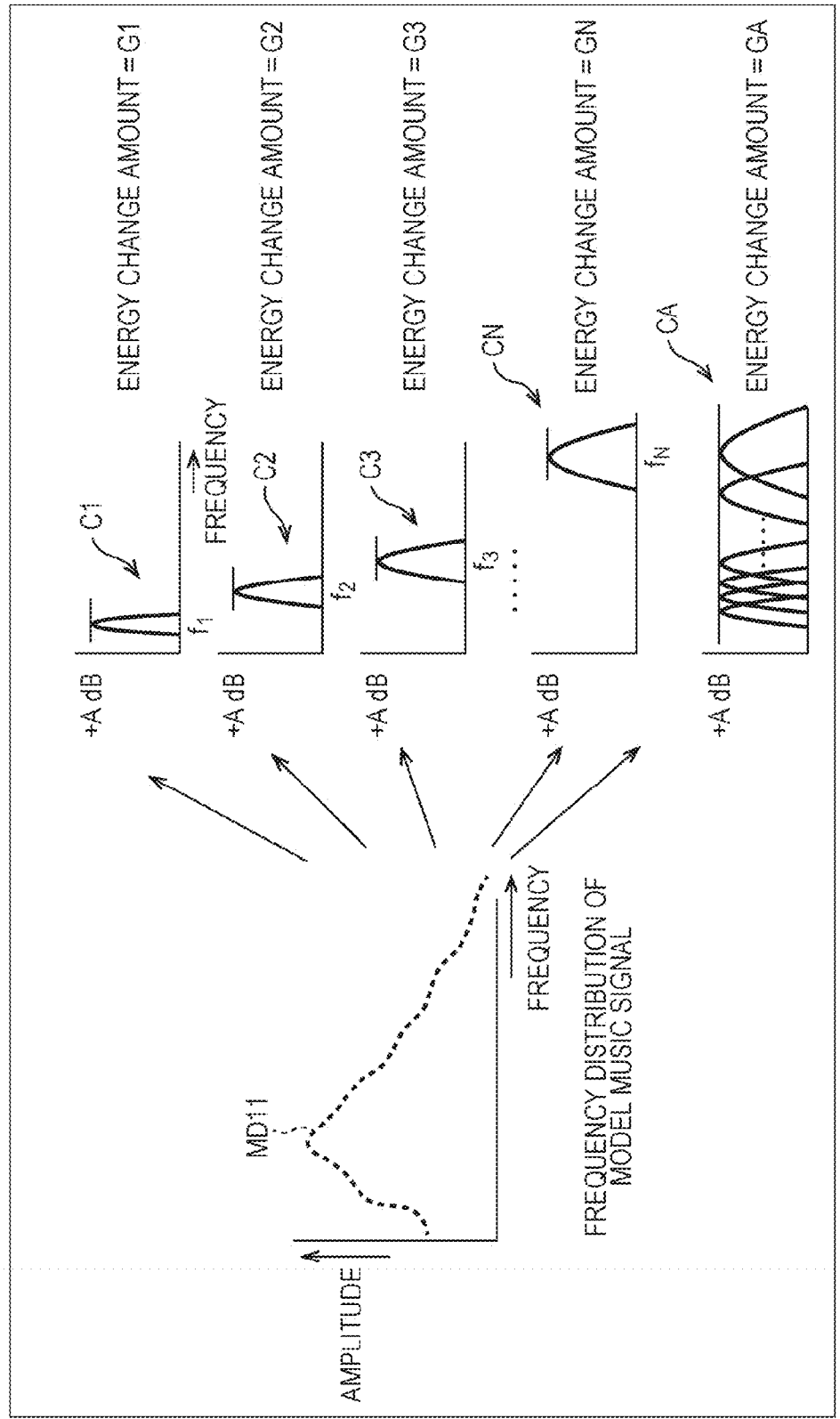
FIG. 4 is a figure for explaining calculation of a weight coefficient for each frequency band.

More specifically, for example, suppose that the model music signal of the energy distribution as shown at the left side of FIG. 4 is prepared in advance. In FIG. 4, the horizontal axis denotes the frequency, and the vertical axis denotes the amplitude (energy).

In FIG. 4, the curved line MD11 represents the amplitude of each frequency of the model music signal. This curved line MD11 indicates that the model music signal, i.e., the generally available music signal includes much low frequency component and does not include much high frequency component. Therefore, even when the gain of each frequency is amplified by the same gain setting value, it is understood that the contribution rate for the amplification of the energy of the entire model music signal is higher in a lower frequency than in a higher frequency. Accordingly, in the present technique, the weight coefficient $CR_k$ is calculated so that larger weight is given to the frequency band $F_k$ of which contribution rate for the amplification of the energy of the entire model music signal is higher.

For example, first, as shown by arrow C1 to arrow CN, in view of a case where the gain of the frequency bands $F_1$ to $F_N$ of the model music signal is amplified by +AdB, the energy change amount Gk (however, $1 \leq k \leq N$) which is the amplification amount of the energy of the entire model music signal at that occasion is calculated.

More specifically, the energy change amount Gk denotes the change amount of the energy of the entire model music signal in a case where the gain of the frequency band $F_k$ of the model music signal is amplified by +AdB. It should be noted that the energy of the entire model music signal referred to herein means, for example, a root mean square (RMS) of the sample value of each sample of the model music signal.

As indicated by arrow CA, in view of a case where the gain of the each frequency band $F_1$ to $F_N$ of the model music signal is amplified by +AdB, the energy change amount GA of the entire model music signal at that occasion is calculated.

When the energy change amount Gk and the energy change amount GA are obtained in this manner, the following expression (3) is calculated, and the weight coefficient $CR_k$ of the frequency band $F_k$ is calculated.

$$CR_k = GA \times (Gk/\text{SUM}(G1:GN))/A \quad (3)$$

In the expression (3), A denotes the amount of amplification of the gain of each frequency band, and SUM (G1:GN) denotes a summation of the energy change amount G1 to the energy change amount GN.

Therefore, the weight coefficient $CR_k$ of the frequency band $F_k$ is obtained by dividing the energy change amount Gk by the summation of the energy change amount of each frequency band, multiplying the quotient by the energy change amount GA, and further dividing the value obtained as a result by the amplification amount A.

As described above, the weight coefficient $CR_k$ is derived for each frequency band on the basis of the energy distribution of each frequency of the model music signal, whereby the gain amplification amount of the entire signal of processing target by the equalizer processing can be predicted with a higher degree of accuracy.

[Example of Configuration of Sound Processing Apparatus]

Figure 5:
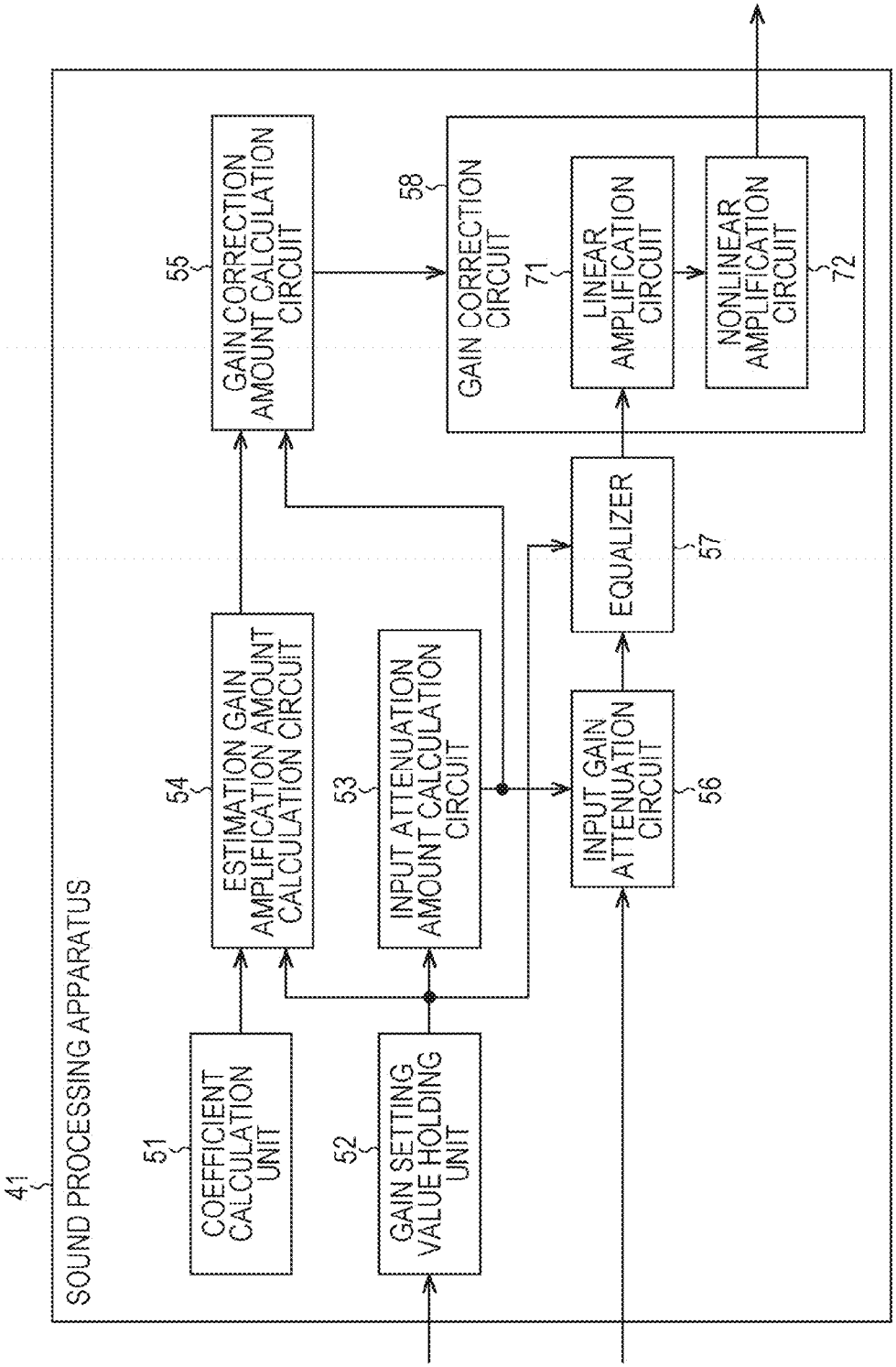
FIG. 5 is a figure illustrating an example of configuration of an embodiment of a sound processing apparatus to which the present technique is applied.

Subsequently, a specific embodiment of a sound processing apparatus for performing the processing explained above will be explained. FIG. 5 is a figure illustrating an example of configuration of an embodiment of a sound processing apparatus to which the present technique is applied.

The sound processing apparatus 41 of FIG. 5 includes a coefficient calculation unit 51, a gain setting value holding unit 52, an input attenuation amount calculation circuit 53, an estimation gain amplification amount calculation circuit 54, a gain correction amount calculation circuit 55, an input gain attenuation circuit 56, an equalizer 57, and a gain correction circuit 58.

The coefficient calculation unit 51 calculates the weight coefficient $CR_k$ of each frequency band on the basis of the model music signal recorded in advance, and provides it to the estimation gain amplification amount calculation circuit 54. The gain setting value holding unit 52 temporarily holds the gain setting value provided in response to user's input operation, and provides the gain setting value to the input attenuation amount calculation circuit 53, the estimation gain amplification amount calculation circuit 54, and the equalizer 57.

The input attenuation amount calculation circuit 53 calculates the input attenuation amount G_ATN on the basis of the gain setting value provided from the gain setting value holding unit 52, and provides it to the gain correction amount calculation circuit 55 and the input gain attenuation circuit 56. The estimation gain amplification amount calculation circuit 54 calculates the estimation gain amplification amount G_EST on the basis of the weight coefficient given by the coefficient calculation unit 51 and the gain setting value given by the gain setting value holding unit 52, and provides it to the gain correction amount calculation circuit 55.

The gain correction amount calculation circuit 55 calculates the gain correction amount G_CMP on the basis of the estimation gain amplification amount given by the estimation gain amplification amount calculation circuit 54 and the input attenuation amount given by the input attenuation amount calculation circuit 53, and provides it to the gain correction circuit 58.

The input gain attenuation circuit 56 attenuates the gain of the provided input signal on the basis of the input attenuation amount provided by the input attenuation amount calculation circuit 53, and provides it to the equalizer 57. The equalizer 57 performs the equalizer processing on the input signal given by the input gain attenuation circuit 56 on the basis of the gain setting value provided by the gain setting value holding unit 52, and provides it to the gain correction circuit 58.

The gain correction circuit 58 performs the gain correction on the input signal provided from the equalizer 57 on the basis of the gain correction amount provided from the gain correction amount calculation circuit 55, and outputs the output signal obtained as a result. The gain correction circuit 58 includes a linear amplification circuit 71 and a nonlinear amplification circuit 72.

The linear amplification circuit 71 performs the linear amplification processing on the input signal provided from the equalizer 57, and provides it to the nonlinear amplification circuit 72. The nonlinear amplification circuit 72 performs the nonlinear amplification processing on the input signal provided from the linear amplification circuit 71, and outputs the output signal obtained as a result.

[Explanation about Sound Processing]

Figure 6:
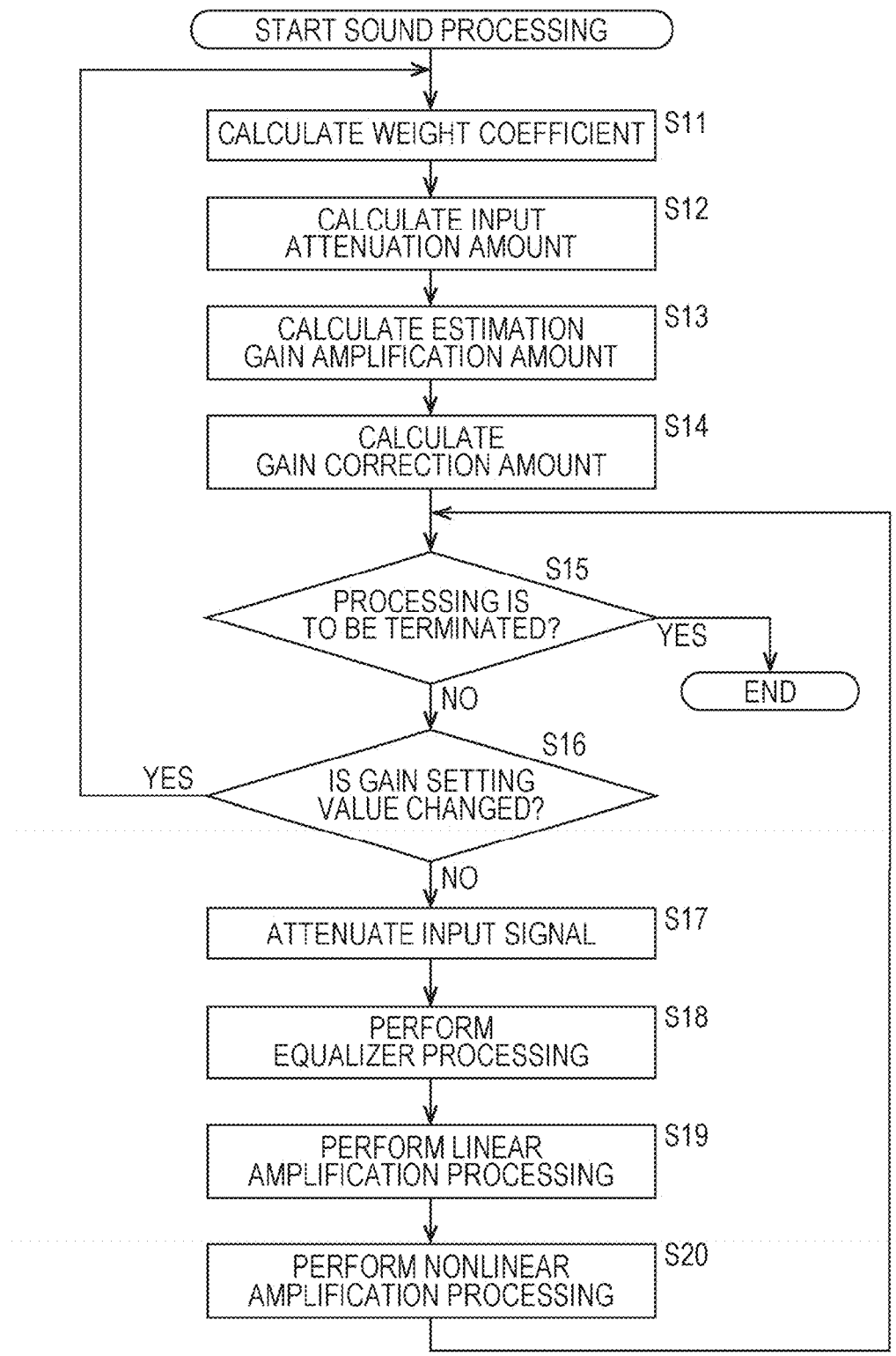
FIG. 6 is a flowchart for explaining sound processing.

When an input signal which is processing target is provided to the sound processing apparatus 41, and the gain adjustment of the input signal is commanded, the sound processing apparatus 41 performs the sound processing to convert the input signal into an output signal, and outputs the output signal. Hereinafter, the sound processing performed by the sound processing apparatus 41 will be explained with reference to the flowchart of FIG. 6.

In step S11, the coefficient calculation unit 51 performs the calculation of the expression (3) explained above on the basis of the model music signal recorded in advance to calculate the weight coefficient $CR_k$ of each frequency band, and provides the obtained weight coefficient to the estimation gain amplification amount calculation circuit 54.

It should be noted that the weight coefficient may be calculated in advance and recorded to the coefficient calculation unit 51. In such case, the coefficient calculation unit 51 reads the recorded weight coefficient and provides it to the estimation gain amplification amount calculation circuit 54.

In step S12, the input attenuation amount calculation circuit 53 calculates the expression (1) explained above on the basis of the gain setting value provided by the gain setting value holding unit 52, thus calculating the input attenuation amount G_ATN, and provides it to the gain correction amount calculation circuit 55 and the input gain attenuation circuit 56.

In step S13, the estimation gain amplification amount calculation circuit 54 calculates the expression (2) explained above on the basis of the gain setting value $EQ_k$ given by the gain setting value holding unit 52 and the weight coefficient $CR_k$ given by the coefficient calculation unit 51, thus calculating the estimation gain amplification amount G_EST. The estimation gain amplification amount calculation circuit 54 provides the calculated estimation gain amplification amount to the gain correction amount calculation circuit 55.

In step S14, the gain correction amount calculation circuit 55 derives a difference between the estimation gain amplification amount given by the estimation gain amplification amount calculation circuit 54 and the input attenuation amount given by the input attenuation amount calculation circuit 53, thus calculating the gain correction amount G_CMP, and provides it to the gain correction circuit 58. More specifically, the difference between the absolute value of the estimation gain amplification amount and the absolute value of the input attenuation amount is adopted as a gain correction amount.

As a result of the above processing, the input attenuation amount G_ATN, the estimation gain amplification amount G_EST, and the gain correction amount G_CMP which are appropriate are calculated in accordance with the gain setting value designated by the user.

In step S15, the sound processing apparatus 41 determines whether the processing is to be terminated or not. For example, the equalizer processing is performed on all the samples of the provided input signal, and when all the samples of the output signal have been generated, the sound processing apparatus 41 determines that the processing is to be terminated. More specifically, when the processing is performed on all the samples of the input signal, the sound processing apparatus 41 determines that the processing is to be terminated.

In step S15, when the sound processing apparatus 41 determines that the processing is not to be terminated yet, the sound processing apparatus 41 determines whether the user has changed the gain setting value or not in step S16. For example, when a gain setting value is provided to the gain setting value holding unit 52, the sound processing apparatus 41 determines that the gain setting value has been changed.

In step S16, when the sound processing apparatus 41 determines that the gain setting value has been changed, the sound processing apparatus 41 returns back to the processing in step S11 to perform the processing explained above. More specifically, the input attenuation amount, the estimation gain amplification amount, and the gain correction amount which are appropriate are calculated in accordance with the gain setting value newly designated.

In contrast, when the sound processing apparatus 41 determines that the gain setting value has not been changed in step S16, the sound processing apparatus 41 proceeds to the processing in step S17.

In step S17, the input gain attenuation circuit 56 attenuates the gain of the provided input signal by the input attenuation amount G_ATN provided by the input attenuation amount calculation circuit 53, and provides it to the equalizer 57.

In step S18, the equalizer 57 performs the equalizer processing on the input signal provided by the input gain attenuation circuit 56 on the basis of the gain setting value provided by the gain setting value holding unit 52, and provides the input signal having been subjected to the equalizer processing to the linear amplification circuit 71. In the equalizer processing, the gain of each frequency band of the input signal is amplified by the gain setting value.

In step S19, the linear amplification circuit 71 performs the linear amplification processing on the input signal provided by the equalizer 57, and provides it to the nonlinear amplification circuit 72.

For example, the gain correction circuit 58 distributes the gain correction amount G_CMP provided by the gain correction amount calculation circuit 55 to the linear amplification circuit 71 and the nonlinear amplification circuit 72 with a predetermined ratio. The linear amplification circuit 71 amplifies, in a linear manner, the amplitude of the input signal so as to amplify the gain of the input signal provided by the equalizer 57 by the portion of the gain correction amount G_CMP that has been distributed to the linear amplification circuit 71, and provides it to the nonlinear amplification circuit 72. More specifically, linear amplitude conversion is performed on the input signal.

In step S20, the nonlinear amplification circuit 72 performs the nonlinear amplification processing on the input signal provided by the linear amplification circuit 71, and outputs the output signal obtained as a result.

More specifically, the nonlinear amplification circuit 72 amplifies, in a nonlinear manner, the amplitude of the input signal so as to amplify the gain of the input signal provided by the linear amplification circuit 71 by the portion of the gain correction amount G_CMP that has been distributed to the nonlinear amplification circuit 72, and adopts it as the output signal. More specifically, nonlinear amplitude conversion is performed on the input signal. In this case, for example, where the portion of the gain correction amount G_CMP that has been distributed to the linear amplification processing is α, a value obtained by subtracting the correction amount α from the gain correction amount G_CMP is a correction amount distributed to the nonlinear amplification processing.

When the nonlinear amplification processing is performed on the input signal, the output signal obtained as a result is a signal amplified to the amplitude close to the input signal, and therefore the clip distortion can be alleviated.

The amplification characteristics in the nonlinear amplification processing performed on the input signal are amplification characteristics such that clip distortion of the output signal is less likely to occur. For example, in a case where the gain amplification amount of the input signal when the equalizer processing is actually performed on the input signal is more than the estimation gain amplification amount G_EST, the clip distortion occurs in the output signal when the gain is amplified by the gain correction amount by performing only the linear gain amplification processing on the input signal. However, when the third harmonic is generated by performing the nonlinear amplification processing on the input signal after the linear amplification processing, the output signal can be obtained in which the clip distortion is alleviated.

As described above, the linear amplification processing is performed on the input signal, and then the nonlinear amplification processing is performed, and a summation is obtained, and the gain of the input signal is amplified by the gain correction amount G_CMP, so that the distortion of the waveform of the output signal is alleviated, and high quality sound can be obtained.

In this explanation, both of the linear amplification processing and the nonlinear amplification processing are performed on the input signal, but only any one of the processing may be performed on the input signal. The distribution of the gain correction amount G_CMP for the linear amplification processing and the nonlinear amplification processing may be done with a ratio defined in advance, and the distribution ratio of the gain correction amount may be defined on the basis of the characteristics of the input signal.

When the output signal is generated in step S20, the processing in step S15 is performed back again, and the processing explained above is repeated. More specifically, the processing is performed on a sample of the input signal that has not yet processed, and the output signal is generated.

When the processing is performed on all the samples of the input signal, and the processing is determined to be terminated in step S15, then the sound processing is terminated.

As described above, the sound processing apparatus 41 calculates the input attenuation amount G_ATN and the gain correction amount G_CMP from the gain setting value designated by the user and the model music signal prepared in advance. Then, the sound processing apparatus 41 attenuates the input signal by the input attenuation amount and then performs the equalizer processing, and performs the linear amplification processing and the nonlinear amplification processing on the signal obtained as a result, so that the gain of the signal is amplified by the gain correction amount, and it is adopted as an output signal.

As described above, the equalizer processing is performed upon attenuation by the input attenuation amount, and the input signal is amplified by the gain correction amount after the equalizer processing, so that the clip distortion is alleviated, and the output signal of the amplitude close to the input signal can be obtained, and this can alleviate the degradation of the quality of the sound.

In particular, in the sound processing apparatus 41, the estimation gain amplification amount G_EST is uniquely obtained by the gain setting value, and as long as the user does not change the gain setting value, the same input attenuation amount G_ATN and the gain correction amount G_CMP are used in a fixed manner throughout one song. In other words, the sound processing apparatus 41 does not perform forced amplitude correction depending on the change of the amplitude of the input signal, which is done in a conventional auto gain control processing. Therefore, unnatural amplitude change does not occur in the output signal, and the user does not feel uncomfortable feeling in terms of audibility.

The energy distribution of each frequency of the model music signal used for calculation of the weight coefficient may be derived on the basis of music signals of multiple songs. In such case, for example, representing values of energy of each frequency of the music signals are derived, and the distribution of the representing value of each frequency thus obtained is adopted as the energy distribution of each frequency of the model music signal.

For each song, the energy distribution of the frequency of the music signal of the song is derived, and the energy distribution thus obtained may be used as the energy distribution of the frequency of the model music signal in a case where the music signal of the song is adopted as the input signal. In this case, since the energy distribution of the input signal itself which is the processing target is used, more appropriate estimation gain amplification amount G_EST can be obtained as compared with the case where the representing value explained above is derived. Accordingly, in the gain correction processing in a later stage, the output signal decreases due to the lack of the estimation gain amplification amount G_EST, and the deformation of the wave form of the output signal in the nonlinear amplification processing can be alleviated, and therefore the quality of the sound can be improved.

Further, even in the same song, when there is a section where the amplitude of the music signal is large and the clip is likely to occur, such section is extracted, and the energy distribution of each frequency of the signal of the extracted section may be used as the energy distribution of the frequency of the model music signal in a case where the music signal of the song is adopted as the input signal. In this case, as compared with the case where the signal of the entire single song is used, more appropriate estimation gain amplification amount can be derived for the section where the clip distortion is likely to occur.

However, a series of processing explained above may be executed by hardware or may be executed by software. When the series of processing is executed by software, programs constituting the software are installed from a program recording medium to a computer incorporated into, e.g., a general-purpose computer capable of executing various kinds of functions by installing various kinds of programs or a computer incorporated into dedicated hardware.

Figure 7:
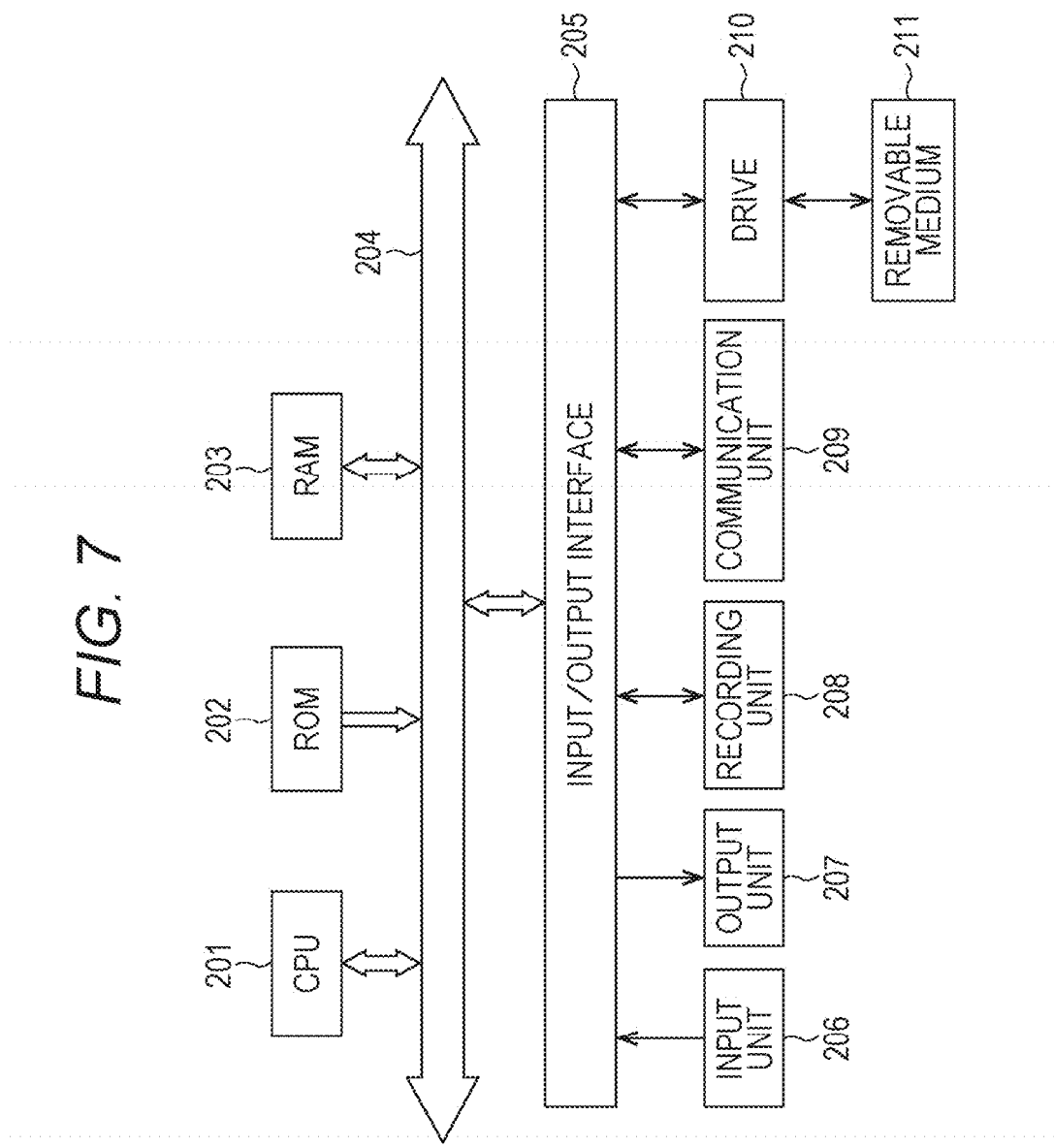
FIG. 7 is a figure illustrating an example of configuration of a computer.

FIG. 7 is a block diagram illustrating an example of configuration of hardware of a computer executing the series of processing explained above using a program.

In the computer, a CPU (Central Processing Unit) 201, ROM (Read Only Memory) 202, and RAM (Random Access Memory) 203 are connected with each other via a bus 204

This bus 204 is also connected to an input/output interface 205. The input/output interface 205 is connected to an input unit 206 made of a keyboard, a mouse, a microphone, and the like, and an output unit 207 made of a display, a speaker, and the like, a recording unit 208 made of a hard disk, non-volatile memory, and the like, a communication unit 209 made of a network interface and the like, and a drive 210 for driving a removable medium 211 such as a magnetic disk, an optical disk, a magneto-optical disk, and a semiconductor memory.

In the computer configured as described above, for example, the CPU 201 loads the program stored in the recording unit 208 via the input/output interface 205 and the bus 204 to the RAM 203, and executes the program, whereby the above series of processing is performed.

For example, the program executed by the computer (CPU 201) is provided upon being recorded to a removable medium 211 which is a magnetic disk (including a flexible disk), an optical disk (a CD-ROM (Compact Disc-Read Only Memory), a DVD (Digital Versatile Disc), and the like), a magneto-optical disk, or a package medium made of semiconductor memory, or provided via a wired or wireless transmission medium such as a local area network, the Internet, and digital satellite braodcast.

When the removable medium 211 is loaded to the drive 210, the program can be installed to the recording unit 208 via the input/output interface 205. The program can also be installed to the recording unit 208 by causing the communication unit 209 to receive the program via a wired or wireless transmission medium. Alternatively, the program can be installed in advance to the ROM 202 or the recording unit 208.

The programs to be executed by the computer may be programs for performing operations in chronological order in accordance with the sequence described in this specification, or may be programs for performing operations in parallel or performing an operation when necessary, such as when there is a call.

The embodiment of the present technique is not limited to the above embodiment, and may be changed in various manners without deviating from the gist of the present technique.

Further, the present technique may be configured as follows.

[1]

A sound processing apparatus including:

an input attenuation amount calculation unit configured to calculate an input attenuation amount for attenuating a sound signal, on the basis of a gain setting value representing an adjustment amount of a gain of each frequency band of a sound signal in equalizer processing;

an estimation gain amplification amount calculation unit configured to calculate an estimation gain amplification amount which is an estimation value of a gain of the sound signal amplified by the equalizer processing, on the basis of the gain setting value and a weight coefficient derived for each of the frequency bands;

a gain correction amount calculation unit configured to calculate a gain correction amount on the basis of the input attenuation amount and the estimation gain amplification amount;

an input gain attenuation unit configured to attenuate the sound signal on the basis of the input attenuation amount;

an equalizer processing unit configured to perform the equalizer processing on the sound signal attenuated by the input gain attenuation unit, on the basis of the gain setting value, and adjust the gain of each of the frequency bands of the sound signal; and a gain correction unit configured to correct the gain of the sound signal having been subjected to the equalizer processing, on the basis of the gain correction amount.

[2]

The sound processing apparatus according to [1] further including a coefficient calculation unit configured to calculate the weight coefficient, on the basis of an energy distribution of a frequency of the sound signal prepared in advance.

[3]

The sound processing apparatus according to [2], wherein for each of the frequency bands, the coefficient calculation unit derives an energy change amount of the sound signal prepared in advance that changes when the gain of the frequency band of the sound signal prepared in advance is amplified by a predetermined value, and calculates the weight coefficient of a particular frequency band on the basis of a summation of the energy change amount of each of the frequency bands and a ratio of the energy change amount of the particular frequency band.

[4]

The sound processing apparatus according to any one of [1] to [3], wherein the estimation gain amplification amount calculation unit calculates, as the estimation gain amplification amount, a summation of the gain setting value multiplied by the weight coefficient.

[5]

The sound processing apparatus according to any one of [1] to [4], wherein the gain correction amount calculation unit calculates the gain correction amount by deriving a difference of the input attenuation amount and the estimation gain amplification amount.

[6]

The sound processing apparatus according to any one of [1] to [5], wherein the gain correction unit performs nonlinear amplification processing on the sound signal on the basis of the gain correction amount so as to amplify the gain of the sound signal.

[7]

The sound processing apparatus according to [6], wherein the gain correction unit performs linear amplification processing on the sound signal so as to amplify the gain of the sound signal by a predetermined amount of the gain correction amounts, and thereafter performs the nonlinear amplification processing on the sound signal so as to amplify the gain of the sound signal having been subjected to the linear amplification processing, by an amount obtained by subtracting the predetermined amount from the gain correction amount.

REFERENCE SIGNS LIST

41 Sound processing apparatus
51 Coefficient calculation unit
53 Input attenuation amount calculation circuit
54 Estimation gain amplification amount calculation circuit
55 Gain correction amount calculation circuit
56 Input gain attenuation circuit
57 Equalizer
71 Linear amplification circuit
72 Nonlinear amplification circuit

The invention claimed is:

1. A sound processing apparatus including:
an input attenuation amount calculation unit configured to calculate an input attenuation amount for attenuating a sound signal, on the basis of a gain setting value representing an adjustment amount of a gain of each frequency band of a sound signal in equalizer processing;
an estimation gain amplification amount calculation unit configured to calculate an estimation gain amplification amount which is an estimation value of a gain of the sound signal amplified by the equalizer processing, on the basis of the gain setting value and a weight coefficient derived for each of the frequency bands;
a gain correction amount calculation unit configured to calculate a gain correction amount on the basis of the input attenuation amount and the estimation gain amplification amount;
an input gain attenuation unit configured to attenuate the sound signal on the basis of the input attenuation amount;
an equalizer processing unit configured to perform the equalizer processing on the sound signal attenuated by the input gain attenuation unit, on the basis of the gain setting value, and adjust the gain of each of the frequency bands of the sound signal; and
a gain correction unit configured to correct the gain of the sound signal having been subjected to the equalizer processing, on the basis of the gain correction amount.

2. The sound processing apparatus according to claim 1 further comprising a coefficient calculation unit configured to calculate the weight coefficient, on the basis of an energy distribution of a frequency of the sound signal prepared in advance.

3. The sound processing apparatus according to claim 2, wherein for each of the frequency bands, the coefficient calculation unit derives an energy change amount of the sound signal prepared in advance that changes when the gain of the frequency band of the sound signal prepared in advance is amplified by a predetermined value, and calculates the weight coefficient of a particular frequency band on the basis of a summation of the energy change amount of each of the frequency bands and a ratio of the energy change amount of the particular frequency band.

4. The sound processing apparatus according to claim 3, wherein the estimation gain amplification amount calculation unit calculates, as the estimation gain amplification amount, a summation of the gain setting value multiplied by the weight coefficient.

5. The sound processing apparatus according to claim 4, wherein the gain correction amount calculation unit calculates the gain correction amount by deriving a difference of the input attenuation amount and the estimation gain amplification amount.

6. The sound processing apparatus according to claim 5, wherein the gain correction unit performs nonlinear amplification processing on the sound signal on the basis of the gain correction amount so as to amplify the gain of the sound signal.

7. The sound processing apparatus according to claim 6, wherein the gain correction unit performs linear amplification processing on the sound signal so as to amplify the gain of the sound signal by a predetermined amount of the gain correction amounts, and thereafter performs the nonlinear amplification processing on the sound signal so as to amplify the gain of the sound signal having been subjected to the linear amplification processing, by an amount obtained by subtracting the predetermined amount from the gain correction amount.

8. A sound processing method comprising:
an input attenuation amount calculation step for calculating an input attenuation amount for attenuating a sound signal, on the basis of a gain setting value representing an adjustment amount of a gain of each frequency band of a sound signal in equalizer processing;
an estimation gain amplification amount calculation step for calculating an estimation gain amplification amount which is an estimation value of a gain of the sound signal amplified by the equalizer processing, on the basis of the gain setting value and a weight coefficient derived for each of the frequency bands;
a gain correction amount calculation step for calculating a gain correction amount on the basis of the input attenuation amount and the estimation gain amplification amount;

an input gain attenuation step for attenuating the sound signal on the basis of the input attenuation amount;

an equalizer processing step for performing the equalizer processing on the sound signal attenuated in the input gain attenuation step, on the basis of the gain setting value, and adjusting the gain of each of the frequency bands of the sound signal; and a gain correction step for correcting the gain of the sound signal having been subjected to the equalizer processing, on the basis of the gain correction amount.

9. A non-transitory computer readable medium having stored thereon, a set of computer executable instructions for causing a computer to execute processing comprising:

calculating an input attenuation amount for attenuating a sound signal, on the basis of a gain setting value representing an adjustment amount of a gain of each frequency band of a sound signal in equalizer processing;

calculating an estimation gain amplification amount which is an estimation value of a gain of the sound signal amplified by the equalizer processing, on the basis of the gain setting value and a weight coefficient derived for each of the frequency bands;

calculating a gain correction amount on the basis of the input attenuation amount and the estimation gain amplification amount;

attenuating the sound signal on the basis of the input attenuation amount;

performing the equalizer processing on the attenuated sound signal, on the basis of the gain setting value, and adjusting the gain of each of the frequency bands of the sound signal; and correcting the gain of the sound signal having been subjected to the equalizer processing, on the basis of the gain correction amount.

* * * * *